(12) United States Patent
Agatuma

(10) Patent No.: US 11,418,004 B2
(45) Date of Patent: Aug. 16, 2022

(54) ELEMENT STRUCTURE AND LIGHT-EMITTING DEVICE

(71) Applicant: SONY SEMICONDUCTOR SOLUTIONS CORPORATION, Kanagawa (JP)

(72) Inventor: Shinichi Agatuma, Miyagi (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 692 days.

(21) Appl. No.: 16/316,109

(22) PCT Filed: May 18, 2017

(86) PCT No.: PCT/JP2017/018671
§ 371 (c)(1),
(2) Date: Jan. 8, 2019

(87) PCT Pub. No.: WO2018/016164
PCT Pub. Date: Jan. 25, 2018

(65) Prior Publication Data
US 2021/0288465 A1    Sep. 16, 2021

(30) Foreign Application Priority Data
Jul. 22, 2016   (JP) .............................. JP2016-144097

(51) Int. Cl.
*H01S 5/024*     (2006.01)
*H01S 5/023*     (2021.01)
(Continued)

(52) U.S. Cl.
CPC .......... *H01S 5/02469* (2013.01); *H01S 5/023* (2021.01); *H01S 5/0216* (2013.01); *H01S 5/0237* (2021.01)

(58) Field of Classification Search
CPC .... H01S 5/02469; H01S 5/0216; H01S 5/023; H01S 5/0237
See application file for complete search history.

(56) References Cited

U.S. PATENT DOCUMENTS

2004/0233951 A1   11/2004  Moriya et al.
2005/0127144 A1    6/2005  Mochida et al.
(Continued)

FOREIGN PATENT DOCUMENTS

CN    103620764 A    3/2014
EP    2721636 A1     4/2014
(Continued)

OTHER PUBLICATIONS

International Search Report and Written Opinion of PCT Application No. PCT/JP2017/018671, dated Aug. 1, 2017, 11 pages of ISRWO.
(Continued)

*Primary Examiner* — Yuanda Zhang
(74) *Attorney, Agent, or Firm* — Chip Law Group

(57) ABSTRACT

Provided is an element structure includes a heat dissipation member and a support member provided on the heat dissipation member. The support member includes a first mount material, a stress relaxation layer, and a second mount material in a stacking direction. The element structure further includes a functional element provided on the support member.

8 Claims, 5 Drawing Sheets

(51) Int. Cl.
*H01S 5/02* (2006.01)
*H01S 5/0237* (2021.01)

(56) References Cited

U.S. PATENT DOCUMENTS

| | | | |
|---|---|---|---|
| 2005/0167679 A1* | 8/2005 | Ishii | H01S 5/0235 257/79 |
| 2006/0227827 A1 | 10/2006 | Kawanishi et al. | |
| 2012/0177074 A1 | 7/2012 | Liu et al. | |
| 2014/0110843 A1 | 4/2014 | Ovtchinnikov et al. | |

FOREIGN PATENT DOCUMENTS

| | | |
|---|---|---|
| JP | 02-257689 A | 10/1990 |
| JP | 04-286177 A | 10/1992 |
| JP | 11-307875 A | 11/1999 |
| JP | 2001-127375 A | 5/2001 |
| JP | 2004-200499 A | 7/2004 |
| JP | 2004-349294 A | 12/2004 |
| JP | 2004-356429 A | 12/2004 |
| JP | 2006-100369 A | 4/2006 |
| JP | 2006-294943 A | 10/2006 |
| JP | 2006-344743 A | 12/2006 |
| JP | 2008-172141 A | 7/2008 |
| JP | 2008-311556 A | 12/2008 |
| JP | 2009-043806 A | 2/2009 |
| JP | 2009-111065 A | 5/2009 |
| JP | 2014-518450 A | 7/2014 |
| JP | 2014-225660 A | 12/2014 |
| KR | 10-2014-0098109 A | 8/2014 |
| WO | 2012/173631 A1 | 12/2012 |

OTHER PUBLICATIONS

Office Action for JP Patent Application No. 2018-528416, dated Mar. 9, 2021, 03 pages of English Translation and 02 pages of Office Action.

Office Action for Japanese Application No. 2018-528416 dated Jan. 5, 2021.

* cited by examiner

[FIG. 1]
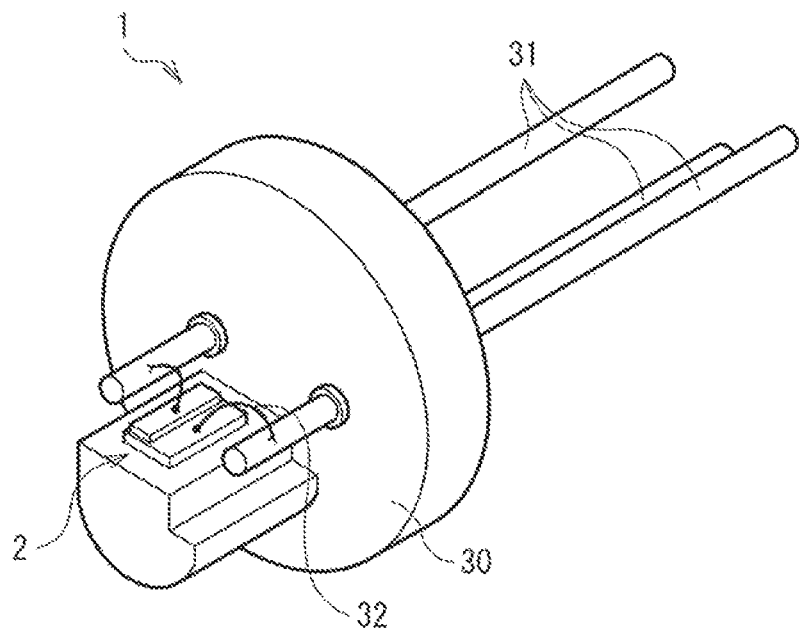
[FIG. 2]
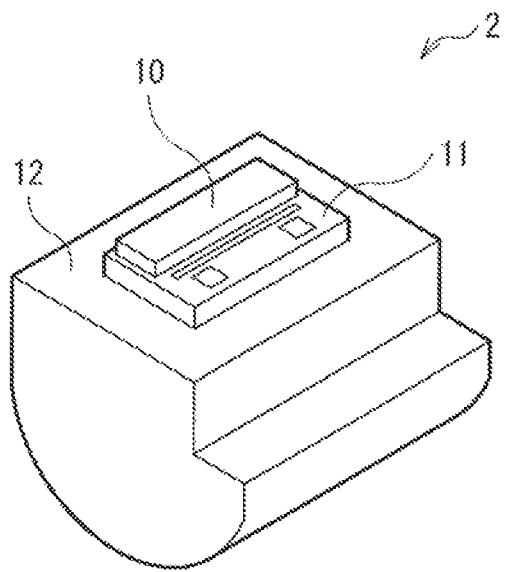

[ FIG. 3 ]
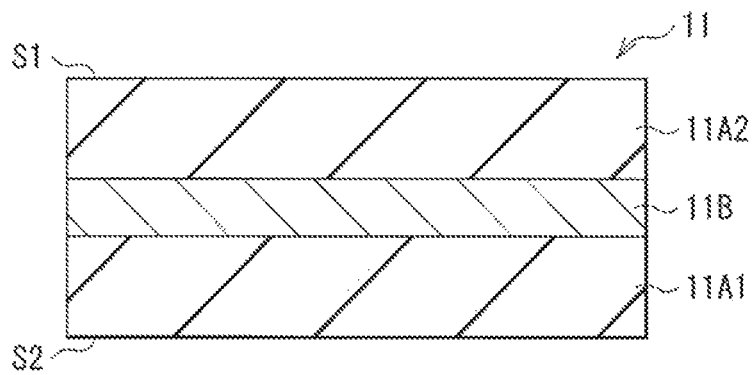
[ FIG. 4A ]
[ FIG. 4B ]
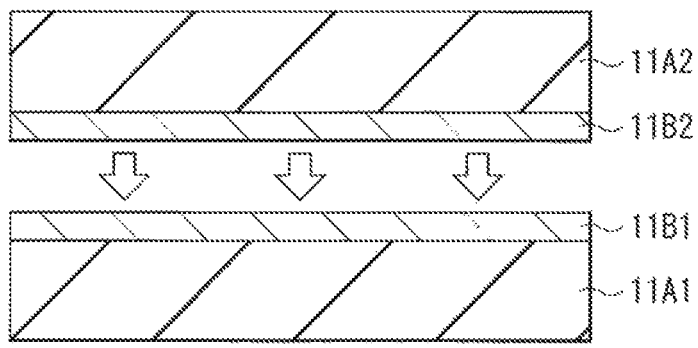
[ FIG. 4C ]
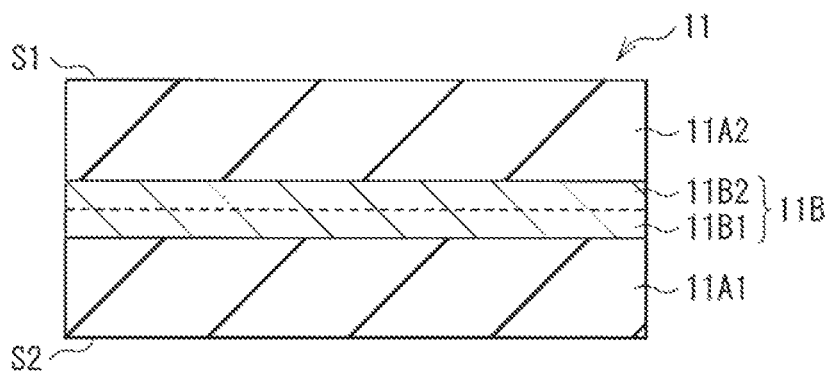

[FIG. 5]
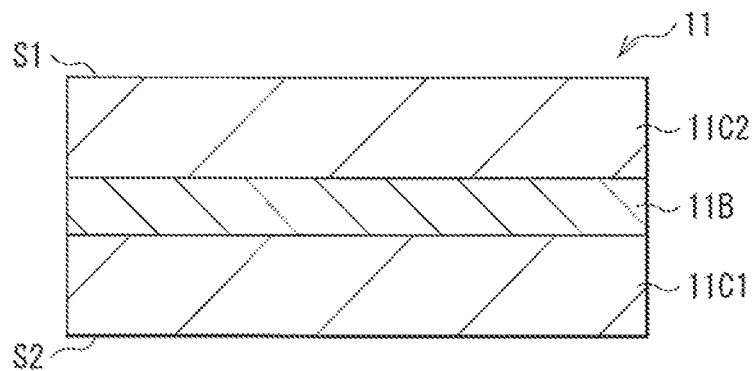
[FIG. 6]
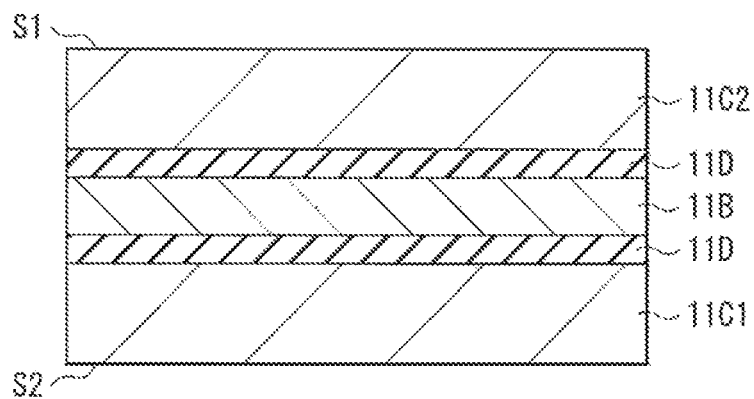
[FIG. 7]
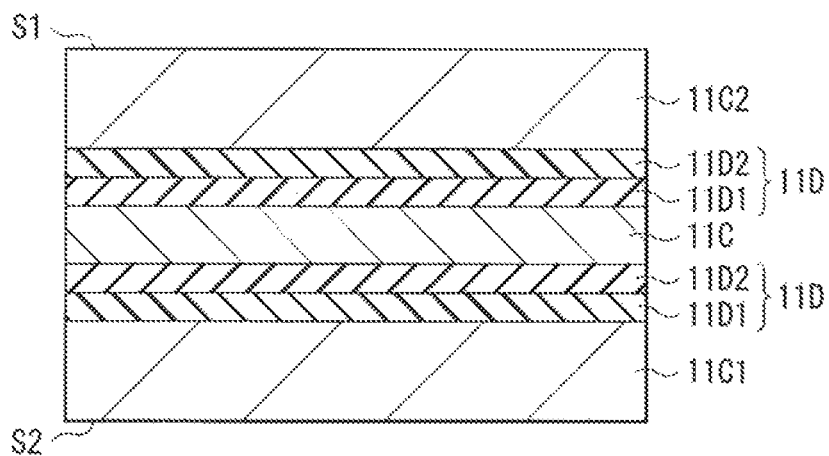

[ FIG. 8 ]
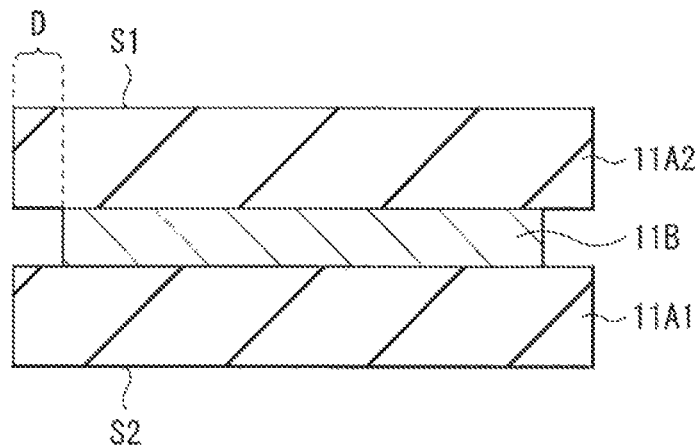
[ FIG. 9 ]
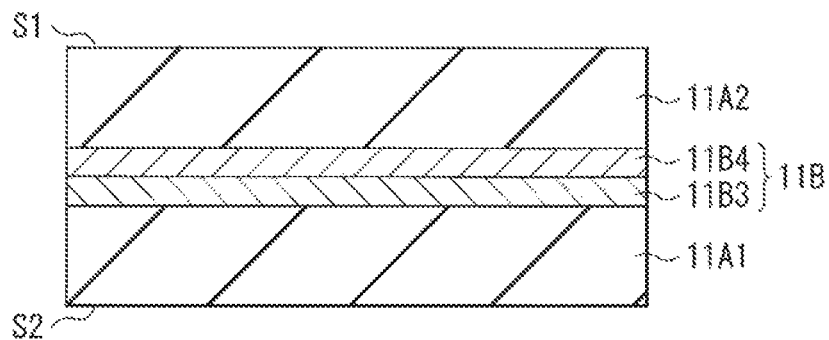
[ FIG. 10 ]
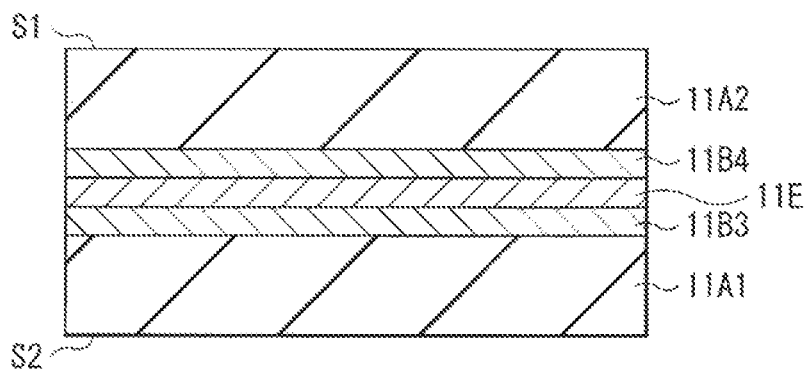

[ FIG. 11 ]
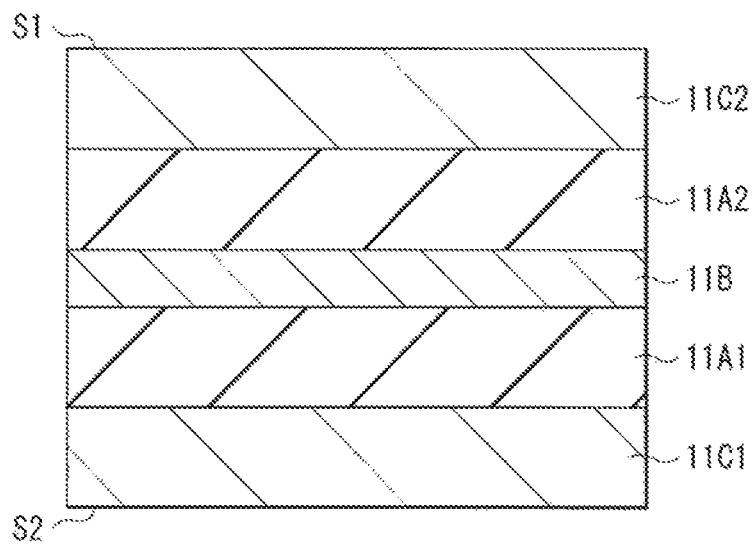

ELEMENT STRUCTURE AND LIGHT-EMITTING DEVICE

CROSS REFERENCE TO RELATED APPLICATIONS

This application is a U.S. National Phase of International Patent Application No. PCT/JP2017/018671 filed on May 18, 2017, which claims priority benefit of Japanese Patent Application No. JP 2016-144097 filed in the Japan Patent Office on Jul. 22, 2016. Each of the above-referenced applications is hereby incorporated herein by reference in its entirety.

TECHNICAL FIELD

The present disclosure relates to an element structure and a light-emitting device including the element structure.

BACKGROUND ART

In recent years, a light-emitting element such as a semiconductor laser has been used as a light source for various types of electronic apparatuses such as a high-density optical disk apparatus, a laser beam printer, and a full-color display. Such a light-emitting element is mounted on a heat dissipation member such as a heat sink via a support member such as a sub-mount (PTLs 1 to 6, for example).

CITATION LIST

Patent Literature

PTL 1: Japanese Unexamined Patent Application Publication No. 2006-100369
PTL 2: Japanese Unexamined Patent Application Publication No. 2009-43806
PTL 3: Japanese Unexamined Patent Application Publication No. H4-286177
PTL 4: Japanese Unexamined Patent Application Publication No. 2006-344743
PTL 5: Japanese Unexamined Patent Application Publication No. 2004-200499
PTL 6: Japanese Unexamined Patent Application Publication No. 2014-225660

SUMMARY OF THE INVENTION

In an element structure including a light-emitting element as described above, stress is easily generated due to a difference in thermal expansion coefficients between members. It is desirable to provide an element structure and a light-emitting device which make it possible to reduce influence of stress on a functional element such as a light-emitting element.

An element structure according to an embodiment of the present disclosure includes a heat dissipation member, a support member provided on the heat dissipation member and including therein a stress relaxation layer in a stacking direction, and a functional element provided on the support member.

A light-emitting device according to an embodiment of the present disclosure includes a heat dissipation member, a support member provided on the heat dissipation member and including therein a stress relaxation layer in a stacking direction, and a light-emitting element provided on the support member.

In the element structure and the light-emitting device according to the respective embodiments of the present disclosure, the support member provided on the heat dissipation member includes therein the stress relaxation layer in the stacking direction. The stress relaxation layer absorbs or divides the stress generated due to the difference in the thermal expansion coefficients between the heat dissipation member and the support member, for example.

In the element structure and the light-emitting device according to the respective embodiments of the present disclosure, the support member provided on the heat dissipation member includes therein the stress relaxation layer in the stacking direction. This enables the stress generated due to the difference in the thermal expansion coefficients between the heat dissipation member and the support member, for example, to be absorbed or divided, thus making it possible to inhibit the stress from being applied to the functional element (light-emitting element) on the support member. It becomes possible to reduce the influence of the stress on the functional element.

It is to be noted that the effects of the disclosure are not limited to those described above, and may be any of the effects described herein.

BRIEF DESCRIPTION OF DRAWINGS

FIG. 1 is a perspective view of a configuration example of a light-emitting device according to a first embodiment of the present disclosure.
FIG. 2 is an enlarged view of a configuration of an element structure illustrated in FIG. 1.
FIG. 3 is a schematic cross-sectional view of a configuration example of a support member illustrated in FIG. 2.
FIG. 4A is an explanatory schematic cross-sectional view of a manufacturing process of the support member illustrated in FIG. 2.
FIG. 4B is a schematic cross-sectional view of a process following FIG. 4A.
FIG. 4C is a schematic cross-sectional view of a process following FIG. 4B.
FIG. 5 is a schematic cross-sectional view of a configuration example of a support member of a light-emitting device according to a second embodiment of the present disclosure.
FIG. 6 is a schematic cross-sectional view of a configuration example of a support member according to Modification Example 1.
FIG. 7 is a schematic cross-sectional view of a configuration example of a support member according to Modification Example 2.
FIG. 8 is a schematic cross-sectional view of a configuration example of a support member according to Modification Example 3.
FIG. 9 is a schematic cross-sectional view of a configuration example of a support member according to Modification Example 4.
FIG. 10 is a schematic cross-sectional view of a configuration example of a support member according to Modification Example 5.
FIG. 11 is a schematic cross-sectional view of a configuration example of a support member according to Modification Example 6.

MODES FOR CARRYING OUT THE INVENTION

In the following, some embodiments of the present disclosure are described in detail with reference to the drawings. The embodiments described below each illustrate a specific example of the present disclosure, and the present disclosure is not limited to the following embodiments. Moreover, the present disclosure is not limited to positions, dimensions, dimension ratios, and other factors of respective components illustrated in the drawings. It is to be noted that description is given in the following order.
1. First Embodiment (An example of a light-emitting device having a stress relaxation layer within a support member of an element structure)
2. Second Embodiment (An example a case where a mount material of the support member is electrically conductive)
3. Modification Example 1 (An example where an insulating layer is provided between the mount material and the stress relaxation layer)
4. Modification Example 2 (An example of a case where the insulating layer is a multi-layer film)
5. Modification Example 3 (An example where the stress relaxation layer is formed in a selective region of the support member)
6. Modification Example 4 (An example of a case where the stress relaxation layer is a multi-layer film)
7. Modification Example 5 (An example of a case where an adhesion layer lies between the stress relaxation layers)
8. Modification Example 6 (An example of a case where a plurality of mount materials are provided on one side of the stress relaxation layer)

First Embodiment

[Configuration]

FIG. 1 illustrates a configuration example of a light-emitting device 1 including an element structure 2 according to a first embodiment of the present disclosure. FIG. 2 illustrates the element structure of FIG. 1 in an enlarged manner. The light-emitting device 1 is used as a light source module for various types of electronic apparatuses. Examples of the electronic apparatuses include a high-density optical disk apparatus, a laser beam printer, and a full-color display.

The light-emitting device 1 includes, for example, the element structure 2, a stem 30 that serves as a support for the element structure 2, a lead pin 31 as a coupling terminal, and a bonding wire 32 electrically coupling the lead pin 31 and the element structure 2 to each other. The element structure 2 is sealed, as needed, by an external member having a dome shape or a cylindrical shape, etc., for example.

The element structure 2 includes a light-emitting element 10, a support member 11, and a heat dissipation member 12, for example. The support member 11 and the light-emitting element 10 are provided in this order on the heat dissipation member 12.

The light-emitting element 10 is, for example, a semiconductor light-emitting element such as a semiconductor laser. The light-emitting element 10 is mounted, for example, as a radar diode chip or a radar diode bar, on the support member 11. However, the light-emitting element 10 is not limited to the semiconductor laser, and may be, for example, another semiconductor light-emitting element such as a light-emitting diode (LED: Light Emitting Diode) or a super luminescent diode (SLD: Super luminescent diode). In addition, the light-emitting element 10 is not limited to such a semiconductor light-emitting element, and may be an organic electroluminescent element, etc., for example. The light-emitting element 10 is adhered to the support member 11 by a solder including an alloy of gold (Au) and tin (Sn), i.e., an Au—Sn alloy, for example, or by brazing.

The support member 11 includes, for example, the mount material such as a sub-mount, and supports the light-emitting element 10. FIG. 3 illustrates a configuration example of the support member 11. The support member 11 includes therein a stress relaxation layer 11B in a stacking direction. Specifically, the support member 11 has a configuration in which the stress relaxation layer 11B is interposed between a mount material 11A1 and a mount material 11A2, for example. It is to be noted that a surface S1 is set as a surface facing the light-emitting element 10, and a surface S2 is set as a surface facing the heat dissipation member 12.

It is desirable that the mount materials 11A1 and 11A2 include a material having high thermal conductivity, for example. Examples of such a material include a material including diamond, ceramics, and a material including metal. As constituent materials of the mount materials 11A1 and 11A2, an appropriate material may be selected in consideration of thermal expansion coefficients of the light-emitting element 10 and the heat dissipation member 12. In the present embodiment, the mount materials 11A1 and 11A2 include a material having insulation properties (such as the diamond or the ceramics). Examples of the material include aluminum nitride (AlN) (having a thermal expansion coefficient of $4.5 \times 10^{-6}$ [1/K]) and beryllium oxide (BeO) (having a thermal expansion coefficient of $7.6 \times 10^{-6}$ [1/K]). The total of thicknesses of the mount materials 11A1 and 11A2 is 200 μm, for example. The constituent materials of the mount materials 11A1 and 11A2 may be the same as or different from each other. In addition, the thicknesses of the mount materials 11A1 and 11A2 may be the same as or different from each other.

The stress relaxation layer 11B has a capability of absorbing or dividing stress generated in the element structure 2. Specifically, the stress relaxation layer 11B absorbs or divides stress due to a difference in respective thermal expansion coefficients of the light-emitting element 10, the support member 11, and the heat dissipation element 12. In addition, the stress relaxation layer 11B absorbs or divides stress due to a difference in thermal expansion coefficients of the mount materials 11A1 and 11A2. For example, soft metal may be used for such a stress relaxation layer 11B. Examples of the soft metal include tin (Sn), indium (In), and aluminum (Al). The stress relaxation layer 11B includes one or more of these tin, indium, and aluminum. The stress relaxation layer 11B has a thickness in a range from 1 μm to 100 μm, for example. As an example, the stress relaxation layer 11B has a thickness in a range from 10 μm to 20 μm. It is to be noted that an adhesion layer may lie between the stress relaxation layer 11B and each of the mount materials 11A1 and 11A2. In this case, it is desirable that a thermally conductive material be used for the adhesion layer.

(Method of Manufacturing Support Member 11)

FIGS. 4A, 4B, and 4C illustrate an example of a manufacturing process of the support member 11. For example, the support member 11 as described above may be manufactured in the following manner. That is, as illustrated in FIG. 4A, the stress relaxation layer 11B1 including the foregoing soft metal is first formed as a film on a surface of the mount material 11A1 by means of, for example, a vapor deposition method, a sputtering method, a plating method, an ion plating method, or the like. Alternatively, in a case where eutectic metal is used for the stress relaxation layer 11B1, eutectic bonding with use of the eutectic metal enables joining between the mount material 11A1 and the stress relaxation layer 11B1. In addition, the mount material 11A1 and the stress relaxation layer 11B1 may be joined together with the thermally conductive adhesion layer being interposed therebetween.

Likewise, the stress relaxation layer 11B2 is also formed as a film on a surface of another mount material, i.e., the mount material 11A2 by means of a technique similar to the foregoing stress relaxation layer 11B1, for example. It is to be noted that, in this example, a case is assumed where the stress relaxation layers 11B1 and 11B2 are configured by the same material. In addition, although a case is described where the stress relaxation layers 11B1 and 11B2 are respectively formed on the mount materials 11A1 and 11A2, the stress relaxation layer 11B1 (or the stress relaxation layer 11B2) may be formed only on either the mount material 11A1 or 11A2.

Subsequently, as illustrated in FIG. 4B, the mount materials 11A1 and the mount material 11A2 are joined together to cause the stress relaxation layers 11B1 and 11B2 to face each other. As a joining technique, for example, techniques such as thermal compression bonding, diffusion bonding, anodic bonding, and the eutectic bonding may be used, similarly to the joining between the mount material 11A1 and the stress relaxation layer 11B1 as described above.

This causes the stress relaxation layers 11B1 and 11B2 to be integrated between the mount material 11A1 and the mount material 11A2, thus forming the stress relaxation layer 11B, as illustrated in FIG. 4C. Thereafter, peripheral parts of the mount materials 11A1 and 11A2 are processed by means of, for example, dicing, etc. to each have a desired size. In this manner, the support member 11 including therein the stress relaxation layer 11B in the stacking direction is completed.

The support member 11 is adhered to the heat dissipation member 12 by the solder including the alloy of gold (Au) and tin (Sn), i.e., the Au—Sn alloy, for example, or by the brazing.

The heat dissipation member 12 is configured by a heat sink, for example, and has a capability of releasing heat generated from the light-emitting element 10. The heat dissipation member 12 includes, for example, copper (Cu) having high thermal conductivity.

[Workings and Effects]

The light-emitting device 1 of the present embodiment generates heat in accordance with power consumption thereof, while the light-emitting element 10 emits a light (outputs laser light, for example). In addition, in the manufacturing process of the light-emitting device 1, the light-emitting element 10, the support member 11, and the heat dissipation member 12 are adhered by solder bonding, etc., and thus, for example, heat of 200° C. or higher is applied to the light-emitting element 10. Although the heat generated in the light-emitting element 10 is released by the heat dissipation member 12, the stress due to the difference in the thermal expansion coefficients of the support member 11 and the heat dissipation member 12 is generated in the element structure 2 under the influenced of the heat.

Here, for example, a technique as described in the following is proposed to reduce the foregoing stress. That is, in the element structure as described in PTLs 1 and 2, for example, an electrode layer having a partially large thickness is provided between the mount material and the light-emitting element, and an attempt to reduce the stress is made using the electrode layer. In the element structure utilizing the electrode layer, however, in a case where the stress from the heat dissipation member such as the heat sink is large, the large stress is applied to the light-emitting element via the mount material. In addition, in the element structure described in the foregoing PTLs 3 and 4, for example, use of a two-layered mount material allows for reduction of the stress due to the difference in the thermal expansion coefficients between the light-emitting element and an upper mount material. In the element structure using the two-layered mount material, however, the stress due to the difference in the thermal expansion coefficients between a lower mount material and the heat dissipation member influences the light-emitting element; or the stress due to the difference in the thermal expansion coefficients between the upper mount material and the lower mount material influences the light-emitting element.

In contrast, in the present embodiment, the support member 11 provided on the heat dissipation member 12 includes therein the stress relaxation layer 11B in the stacking direction. Specifically, the support member 11 includes the stress relaxation layer 11B between a pair of the mount materials 11A1 and 11A2. The stress relaxation layer 11B absorbs or divides the stress generated due to the difference in the thermal expansion coefficients between the heat dissipation member 12 and the support member 11, for example, thus inhibiting the stress from being applied to the light-emitting element 10 on the support member 11.

In addition, in the present embodiment, it is also possible to absorb or divide the stress generated due to the difference in the thermal expansion coefficients between the two mount materials 11A1 and 11A2 in the support member 11. It is possible to inhibit the stress generated between such mount materials 11A1 and 11A2 from being applied to the light-emitting element 10.

Furthermore, in the present embodiment, the mount materials 11A1 and 11A2 include an insulating material (AlN, for example), thus making it possible to inhibit generation of a leak current in the support member 11.

As described above, in the present embodiment, the support member 11 provided on the heat dissipation member 12 includes therein the stress relaxation layer 11B in the stacking direction. This enables the stress generated due to the difference in the thermal expansion coefficients between the heat dissipation member 12 and the support member 11, for example, to be absorbed or divided, thus making it possible to inhibit the stress from being applied to the light-emitting element 10 on the support member 11. It becomes possible to reduce the influence of the stress on the light-emitting element 10.

Next, description is given of another embodiment and modification examples of the present disclosure. In the following, same components as those of the foregoing first embodiment are denoted by same reference numerals, and description thereof is omitted where appropriate.

Second Embodiment

FIG. 5 illustrates a configuration example of the support member 11 of the element structure 2 according to a second embodiment of the present disclosure. Similarly to the foregoing first embodiment, the support member 11 of the present embodiment is also provided between the light-emitting element 10 and the heat dissipation member 12 to configure the element structure 2.

Similarly to the foregoing first embodiment, the support member 11 of the present embodiment includes therein the stress relaxation layer 11B in the stacking direction. Specifically, the support member 11 of the present embodiment has a configuration in which the stress relaxation layer 11B is interposed between a mount material 11C1 and a mount material 11C2. In the present embodiment, however, the mount materials 11C1 and 11C2 include an electrically conductive material (such as a conductor or a semiconductor), unlike the mount materials 11A1 and 11A2 of the foregoing first embodiment.

It is desirable that the mount materials 11C1 and 11C2 include a material being electrically conductive and highly thermally conductive. Examples of the material include silicon carbide (SiC) (having a thermal expansion coefficient of $3.8 \times 10^{-6}$ [1/K]), for example. Other examples of the material include copper, aluminum, a copper-tungsten alloy (Cu—W) and a copper-molybdenum alloy (Cu—Mo). The total of thicknesses of the mount material 11C1 and the mount material 11C2 is 200 µm, for example. The constituent materials of the mount materials 11C1 and 11C2 may be same as or different from each other. The thicknesses of the mount material 11C1 and the mount material 11C2 may be same as or different from each other.

It is also possible to manufacture the support member 11 by forming the stress relaxation layers 11B1 and 11B2 on respective surfaces of the mount materials 11C1 and 11C2 and thereafter joining them together.

Also in the present embodiment, the support member 11 includes therein the stress relaxation layer 11B in the stacking direction, and thus the stress generated due to the difference in the thermal expansion coefficients between the heat dissipation member 12 and the support member 11, for example, is absorbed or divided. This makes it possible to inhibit the stress from being applied to the light-emitting element 10 on the support member 11. Hence, it is possible to achieve the effects substantially equivalent to those of the foregoing first embodiment.

MODIFICATION EXAMPLE 1

FIG. 6 illustrates a configuration example of a support member according to a modification example (Modification Example 1) of the foregoing second embodiment. In the support member of the present modification example, an insulating layer 11D is provided between each of the mount materials 11C1 and 11C2 and the stress relaxation layer 11B in a stacked structure of the foregoing second embodiment.

The insulating layer 11D includes an insulating material having high thermal conductivity, for example. Such an insulating layer 11D includes, for example, one or more of aluminum nitride, boron nitride (BN), silicon oxide ($SiO_2$), silicon nitride ($Si_3N_4$), aluminum oxide ($Al_2O_3$), zirconium oxide (ZrO), aluminum oxynitride ($AlO_xN_{x-1}$), zinc oxide (ZnO), and tantalum oxide ($Ta_2O_5$), etc.

In this manner, the insulating layer 11D may lie between each of the mount materials 11C1 and 11C2 and the stress relaxation layer 11B. In this case, it is also possible to achieve the effects equivalent to those of the foregoing first embodiment. In addition, in a case where the electrically conductive mount materials 11C1 and 11C2 are used for the support member, the leak current may be generated. However, it is possible to inhibit generation of such a leak current because of the insulating layer 11D lying therebetween. It is to be noted that, in the present modification example, the insulating layer 11D is formed between each of the mount materials 11C1 and 11C2 and the stress relaxation layer 11B; however, the insulating layer 11D may be formed only between one of the mount materials 11C1 and 11C2 and the stress relaxation layer 11B. Moreover, the stress relaxation layer 11B either may be formed on both sides of the mount materials 11C1 and 11C2, or may be formed only on one of the mount materials 11C1 and 11C2.

MODIFICATION EXAMPLE 2

FIG. 7 illustrates a configuration example of a support member according to a modification example (Modification Example 2) of the foregoing second embodiment. In the foregoing Modification Example 1, description has been given of the configuration in which the insulating layer 11D is provided between each of the mount materials 11C1 and 11C2 and the stress relaxation layer 11B. However, the insulating layer 11D may be a multi-layer film including a plurality of layers as in the present modification example. Specifically, the insulating layer 11D may be a multi-layer film including two insulating layers 11D1 and 11D2, for example. As the constituent materials of the insulating layers 11D1 and 11D2, insulating materials similar to those listed as the material for the foregoing insulating layer 11D may be used. The constituent materials of the insulating layers 11D1 and 11D2 may be same as or different from each other. In addition, the thicknesses of the insulating layers 11D1 and 11D2 may be same as or different from each other.

It is to be noted that the insulating layer 11D is not limited to the configuration described above, and may be a multi-layer film of three or more layers. In addition, the insulating material may be same or different between the insulating layer 11D on side of the mount material 11C1 and the insulating layer 11D on side of the mount material 11C2. Moreover, the number of the layers and the thickness may be same or different between the insulating layer 11D on the side of the mount material 11C1 and the insulating layer 11D on the side of the mount material 11C2.

MODIFICATION EXAMPLE 3

FIG. 8 illustrates a configuration example of a support member according to Modification Example 3. In the support member of the present modification example, the stress relaxation layer 11B is formed in a selective region of the support member. For example, the stress relaxation layer 11B is formed in a region excluding a peripheral region D of the support member (mount materials 11A1 and 11A2).

Although the stress relaxation layer 11B may be formed throughout the mount materials 11A1 and 11A2, the stress relaxation layer 11B may be formed only in a selective region as in the present modification example. For example, the stress relaxation layer 11B formed in the region excluding the peripheral region D makes it easier to perform processing such as dicing in the manufacturing process of the foregoing support member, for example.

MODIFICATION EXAMPLE 4

FIG. 9 illustrates a configuration example of a support member according to Modification Example 4. In the foregoing first embodiment, etc., description has been given of the configuration in which the stress relaxation layer 11B is provided between the mount materials 11A1 and 11A2. However, the stress relaxation layer 11B may include a multi-layer film configured by a plurality of layers, as in the present modification example. Specifically, the stress relaxation layer 11B may be a multi-layer film including two stress relaxation layers 11B3 and 11B4, for example. Soft metal similar to those listed as the material for the foregoing stress relaxation layer 11B may be used for the stress relaxation layers 11B3 and 11B4. The constituent materials of the stress relaxation layers 11B3 and 11B4 may be same as or different from each other. In addition, the thicknesses of the stress relaxation layers 11B3 and 11B4 may be same as or different from each other.

It is to be noted that the stress relaxation layer 11B is not limited to the configuration described above, and may be a multi-layer film of three or more layers.

MODIFICATION EXAMPLE 5

FIG. 10 illustrates a configuration example of a support member according to Modification Example 5. In the foregoing Modification Example 4, description has been given of the case where the stress relaxation layer 11B is the multi-layer film including the two stress relaxation layers 11B3 and 11B4. However, in the present modification example, an adhesion layer 11E lies between the stress relaxation layers 11B3 and 11B4. It is desirable that the adhesion layer 11E be configured by a material having high thermal conductivity. In this manner, another layer (adhesion layer 11E, for example) may lie between the stress relaxation layers 11B3 and 11B4.

MODIFICATION EXAMPLE 6

FIG. 11 illustrates a configuration example of a support member according to Modification Example 6. In the foregoing first embodiment, etc., the configuration is exemplified in which the stress relaxation layer 11B is provided between the two mount materials 11A1 and 11A2 (or the two mount materials 11C1 and 11C2). However, the mount material provided in the support member may be three or more (three layers or more). As an example, FIG. 11 illustrates a configuration in which the mount materials 11A1 and 11A2 including an insulating material and the electrically conductive mount materials 11C1 and 11C2 are stacked.

In this manner, a plurality of mount materials may be joined together to interpose the stress relaxation layer 11B. Moreover, the constituent material, the number, and the thickness, etc. of the mount material provided between the stress relaxation layer 11B and the surface S1, and the constituent material, the number, and the thickness, etc. of the mount material provided between the stress relaxation layer 11B and the surface S2 may be same as or different from each other.

Although the description has been given with reference to the embodiments and the modification examples, the present disclosure is not limited to the foregoing embodiments, etc., and may be modified in a variety of ways. For example, the materials, the thicknesses, and the film-forming methods, etc., of the respective layers described in the foregoing embodiments are not limitative, and any other material, any other thickness, and any other film-forming method may be adopted.

In addition, although the foregoing embodiments, etc. exemplify the configuration in which the element structure 2 includes the light-emitting element 10, the element structure 2 may include any element (functional element) other than the light-emitting element. Examples of the functional element may include a diode, a small-signal transistor, a power transistor, a rectifier element, a thyristor, and an optical element.

Moreover, the present disclosure may have the following configurations, for example.

(1)
An element structure including:
a heat dissipation member;
a support member provided on the heat dissipation member and including therein a stress relaxation layer in a stacking direction; and
a functional element provided on the support member.

(2)
The element structure according to (1), in which the support member includes a first mount material, the stress relaxation layer, and a second mount material in order from side of the heat dissipation member.

(3)
The element structure according to (2), in which the first and second mount materials each include an insulating material.

(4)
The element structure according to (3), in which the insulating material is aluminum nitride (AlN).

(5)
The element structure according to any one of (2) to (4), in which the first and second mount materials each include an electrically conductive material.

(6)
The element structure according to (5), in which the support member includes a thermally conductive insulating layer between each of the first and second mount materials and the stress relaxation layer.

(7)
The element structure according to (5) or (6), in which the electrically conductive material is silicon carbide (SiC).

(8)
The element structure according to (6), in which the insulating layer includes one or more of aluminum nitride, boron nitride (BN), silicon oxide ($SiO_2$), silicon nitride ($Si_3N_4$), aluminum oxide ($Al_2O_3$), zirconium oxide (ZrO), aluminum oxynitride ($AlO_xN_{x-1}$), zinc oxide (ZnO), and tantalum oxide ($Ta_2O_5$).

(9)
The element structure according to any one of (1) to (8), in which the stress relaxation layer is formed in a region excluding a peripheral part of the support member.

(10)
The element structure according to any one of (1) to (9), in which the stress relaxation layer includes one or more of tin (Sn), indium (In), and aluminum (Al).

(11)
The element structure according to any one of (1) to (10), in which the stress relaxation layer includes a multi-layer film.

(12)
The element structure according to any one of (1) to (11), in which the functional element is a light-emitting element.

(13)
The element structure according to (12), in which the light-emitting element is a semiconductor laser.

(14)
A light-emitting device including:
a heat dissipation member;
a support member provided on the heat dissipation member and including therein a stress relaxation layer in a stacking direction; and
a light-emitting element provided on the support member.

This application claims the benefit of Japanese Priority Patent Application No. 2016-144097 filed with the Japan Patent Office on Jul. 22, 2016, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An element structure, comprising:
   a heat dissipation member;
   a support member on the heat dissipation member, wherein the support member includes:
      a first mount material, a stress relaxation layer, and a second mount material in order from a side of the heat dissipation member, wherein
         each of the first mount material and the second mount material includes an electrically conductive material, and
         the stress relaxation layer is in a region excluding a peripheral part of the support member such that a length of the stress relaxation layer is smaller than a length of each of the first mount material and the second mount material; and
      a thermally conductive insulating layer between the second mount material and the stress relaxation layer; and
   a functional element on the support member, wherein the second mount material is between the functional element and the stress relaxation layer.

2. The element structure according to claim 1, wherein the electrically conductive material includes at least one of silicon carbide (SiC), copper, aluminum, a copper-tungsten alloy (Cu—W), or a copper-molybdenum alloy (Cu—Mo).

3. The element structure according to claim 1, wherein the thermally conductive insulating layer includes aluminum nitride.

4. The element structure according to claim 1, wherein the stress relaxation layer includes at least one of tin (Sn), indium (In), or aluminum (Al).

5. The element structure according to claim 1, wherein the stress relaxation layer includes a multi-layer film.

6. The element structure according to claim 1, wherein the functional element comprises a light-emitting element.

7. The element structure according to claim 6, wherein the light-emitting element comprises a semiconductor laser.

8. A light-emitting device, comprising:
   a heat dissipation member;
   a support member on the heat dissipation member, wherein the support member includes:
      a first mount material, a stress relaxation layer, and a second mount material in order from a side of the heat dissipation member, wherein
         each of the first mount material and the second mount material includes an electrically conductive material, and
         the stress relaxation layer is in a region excluding a peripheral part of the support member such that a length of the stress relaxation layer is smaller than a length of each of the first mount material and the second mount material; and
      a thermally conductive insulating layer between the second mount material and the stress relaxation layer; and
   a light-emitting element on the support member, wherein the second mount material is between the light-emitting element and the stress relaxation layer.

* * * * *